United States Patent
Shibano et al.

(10) Patent No.: US 6,247,856 B1
(45) Date of Patent: Jun. 19, 2001

(54) DEVELOPING SYSTEM OF PHOTOSENSITIVE RESIN PLATES AND APPARATUS USED THEREIN

(75) Inventors: Hiroshi Shibano; Yoshihiro Kasho; Kazuo Takahashi, all of Ohtsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 0 days.

(21) Appl. No.: 09/234,556

(22) Filed: Jan. 20, 1999

(30) Foreign Application Priority Data

Jan. 22, 1998 (JP) .................................. 10-010681
Jan. 29, 1998 (JP) .................................. 10-016767

(51) Int. Cl.$^7$ .................................................. G03D 3/02
(52) U.S. Cl. .......................... 396/565; 396/626; 430/399
(58) Field of Search .................... 396/626, 630, 396/631, 565; 430/309, 331, 399; 210/651, 725

(56) References Cited

U.S. PATENT DOCUMENTS

| | | | |
|---|---|---|---|
| 3,978,506 | * | 8/1976 | Geyken et al. ................... 396/626 |
| 4,517,282 | | 5/1985 | Tomisawa et al. . |
| 4,519,690 | | 5/1985 | Tomisawa et al. . |
| 4,559,295 | | 12/1985 | Tomisawa et al. . |
| 4,593,986 | | 6/1986 | Tomisawa et al. . |
| 4,752,283 | | 6/1988 | Copeland et al. . |
| 4,786,417 | | 11/1988 | Miki et al. . |
| 5,124,736 | | 6/1992 | Yamamoto et al. . |
| 5,321,458 | | 6/1994 | Shimura et al. . |
| 5,759,743 | | 6/1998 | Muramoto et al. . |
| 5,811,224 | * | 9/1998 | Seeley et al. ...................... 430/399 |
| 5,828,923 | * | 10/1998 | Harabin et al. ................... 396/626 |

FOREIGN PATENT DOCUMENTS

| | | |
|---|---|---|
| 3102135 | 8/1982 | (DE) . |
| 3143106 | 5/1983 | (DE) . |
| 3238134 | 5/1983 | (DE) . |
| 3328264 | 2/1984 | (DE) . |
| 0254550 | 1/1988 | (EP) . |
| 0624828 | 11/1994 | (EP) . |
| 0813116 | 12/1997 | (EP) . |
| 92/22015 | 12/1992 | (WO) . |

* cited by examiner

*Primary Examiner*—Alan A. Mathews
(74) *Attorney, Agent, or Firm*—Leydig, Voit & Mayer, Ltd

(57) ABSTRACT

There is disclosed a system for developing photosensitive resin plates with an aqueous developing solution and for disposing of a waste developing solution. In the system, a fresh developing solution is added to a developing unit in a continuous manner or at intervals of a fixed period, while a part of the resin-containing developing solution is removed from the developing unit, whereby the resin content of the developing solution in the developing unit is kept substantially constant and the disposal of the waste developing solution is carried out in parallel with the development. Also disclosed herein are apparatus used in the developing system.

6 Claims, 2 Drawing Sheets

DEVELOPING SYSTEM OF PHOTOSENSITIVE RESIN PLATES AND APPARATUS USED THEREIN

FIELD OF INVENTION

The present invention relates to a system for development of photo-sensitive resin plates and apparatus used therein, which make it possible to carry out developing operation in a continuous manner over a long period of time, particularly in a process for developing photosensitive resin plates by rubbing off unexposed portions from the plates, while immersing the plates in a developing solution.

BACKGROUND OF THE INVENTION

In recent years, printing plates made of a photosensitive resin are rapidly coming into general use in various fields of printing because of their better handleability, higher productivity, lower price, and improved printing performance as compared with the conventional printing plates. There have been devised and put into practical use several processes for developing photosensitive resin plates by: (1) blowing off unexposed portions from the plates with compressed air or other means to form a relief; (2) spraying a developing solution under a constant pressure to the plates to form a relief; and (3) rubbing off unexposed portions from the plates with a brush or other means, while immersing the plates in a developing solution.

A developing solution for washing out the photosensitive resin plates in a developing process such as described in (3) above contains the dispersed resin from the unexposed portions washed off after the development. The developing solution has an increased resin content after washing out many photosensitive resin plates, causing various problems, e.g., the speed of development is decreased, and the dispersed resin is flocculated to form scum which is then adhered to the plates and the brush. Thus required are frequent disposal of the used developing solution and frequent preparation of a fresh developing solution.

To solve the above problems, some methods have been devised in which the used developing solution is recycled by removing resin components. For example, U.S. Pat. No. 5,124,736 discloses a method for filtering a developing solution in the developing unit and returning the filtrate to the developing unit for reuse as the developing solution. This method, however, is of a closed system, and the reuse of the waste developing solution as the developing solution requires once stopping the continuous development and allowing the pooled waste developing solution to stand for a long period of time (e.g., about 8 hours) so that the resin in the waste developing solution is flocculated and deposited. Thus the development and the waste disposal cannot be carried out in parallel. This method further has a defect that fine particles of resin components cannot be removed and the resin content of the developing solution is increase, lowering the speed of development.

In general, the used resin-containing developing solution has been treated for waste disposal as follows: The developing solution is transferred to another tank after the completing of development, and the resin and the developing agents contained in the developing solution, such as surfactants, are flocculated with a flocculant for making them harmless, after which the mixture is treated for separation of harmless liquids and solids by filtration or other techniques, followed separately by waste disposal. This method, however, requires suspending the developing operation for removing and treating the developing solution at the whole volume. In the case of developing machines requiring a developing solution in quantity and difficult to suspend the developing operation halfway, of which good representatives are automatic developing machines, the resin-containing developing solution is also to be treated in quantity, so that large size tanks, stirrers, and resins are need in a large scale for this treatment and it further takes a long time for suspension. Therefore, this method is not suitable for automatic developing machines.

SUMMARY OF THE INVENTION

Under these circumstances, the present inventors have intensively studied to devise a developing system and apparatus used therein, which make it possible to carry out developing operation in a continuous manner without waste disposal of a developing solution at the whole volume, without suspending the development, and without lowering the speed of development over a long period of time, thereby completing the present invention.

Thus the present invention provides a system for developing photo-sensitive resin plates with an aqueous developing solution and for treating a waste developing solution. In the system, a fresh developing solution is added to a developing unit in a continuous manner or at intervals of a fixed period, while a part of the resin-containing developing solution is removed from the developing unit, whereby the resin content of the developing solution in the developing unit is kept substantially constant and the treatment of the waste developing solution is carried out in parallel with the development.

The present invention further provides the following apparatus used in the above developing system of photo-sensitive resin plates.

One apparatus contains: (i) an additional developing solution tank; (ii) a developing unit; (iii) a resin flocculating unit; (iv) a solid-liquid separating unit for separating the resin and a liquid; (v) a unit for feeding a developing solution from the additional developing solution tank to a developing solution tank; and (vi) a pipe for removing a part of the developing solution from the developing tank to a waste disposal tank.

The other contains: (i) an additional developing solution tank; (ii) a developing unit; (iii) a pipe for feeding a developing solution from the additional developing solution tank to the developing unit; (iv) a concentration tank; (v) a pipe for transferring a waste developing solution from the developing unit to the concentration tank; (vi) a membrane filter module containing at least one membrane filter selected from the group consisting of reverse osmosis membrane filters, ultrafiltration membrane filters, and microfiltration membrane filters; (vii) a circulating pump for transferring the waste solution from the concentration tank to the membrane filter module; (viii) a pipe for returning a circulating waste solution discharged as a cross-flow from the membrane filter module to the concentration tank; (ix) a pipe for returning the filtrate discharged from the membrane filter module to the developing unit; (x) a valve for suspending the transfer of the developing solution, which valve is disposed on the pipe for transferring the developing solution form the developing unit to the concentration tank; (xi) a level gauge disposed in the concentration tank; (xii) a means of stopping a circulating pump when the liquid level in the concentration tank comes to a height equal to or lower than the level gauge; and (xiii) a pipe for removing the developing solution from the concentration tank.

DETAILED DESCRIPTION OF THE INVENTION

Figure 1:
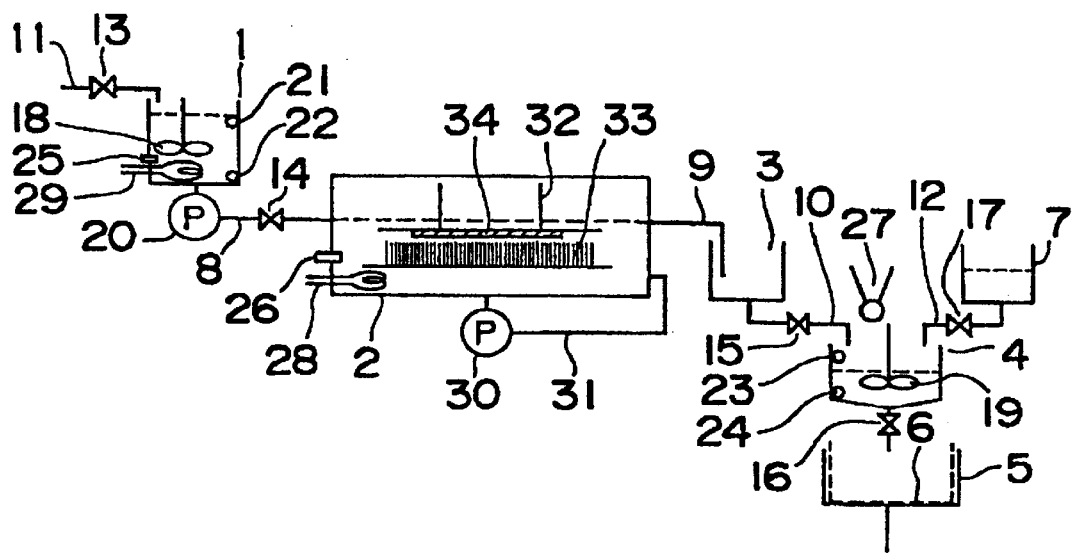
FIG. 1 is a schematic flow diagram showing an example of developing system I according to the present invention.

The photosensitive resin plates used in the present invention may be preferably water-developable photosensitive resin plates form the viewpoint of operating and local environments, which photosensitive resin plates can be developed with developing solutions such as water, aqueous surfactant solution, aqueous alkali solutions, and aqueous acid solutions.

The water-developable photosensitive resin composition may include polyamide-type photosensitive resign compositions containing a polyamide as the essential ingredient; polyvinyl alcohol-type photosensitive resin compositions containing polyvinyl alcohol as the essential component; polyester-type photosensitive resin compositions containing a low molecular weight unsaturated group-containing polyester as the essential component; acrylic photosensitive resin compositions containing a low molecular weight acrylic monomer as the essential component; and polyurethane-type photosensitive resin compositions containing polyurethane as the essential component.

These photosensitive resin compositions are usually rendered photo-sensitivity by additional of photopolymerizable unsaturated monomer, photo-sensitizers, or other agents.

In recent years, even for photosensitive flexographic plates, there have been proposed those which can be developed with aqueous developing solutions from the viewpoint of safety in toxicity. These are also preferably used as the photosensitive resin plates in the present invention. Specific examples thereof are photosensitive resin compositions containing copolymers consisting essentially of conjugate diene-type hydrocarbons and α, β-ethylenically unsaturated carboxylic acids or their salts, with monoolefinically unsaturated compounds as the additional monomers, and further containing photopolymerizable unsaturated monomers and photosensitizers; photosensitive elastomer compositions containing polymers of conjugate diene-type hydrocarbons or copolymers of conjugate diene-type hydrocarbons and monoolefinically unsaturated compounds, hydrophilic high molecular compounds, non-gaseous ethylenically unsaturated compounds, and photo-polymerization initiators as the essential components; and photosensitive resin compositions containing hydrophobic oligomers with α, β-ethylenically unsaturated groups, elastomeric water-swellable substances, and photo-polymerization initiators. Other examples may include photosensitive resin compositions containing hard organic fine particles for improving the performance of printing plates, such as mechanical strength and impact resilience; photosensitive resin compositions containing fine particles of crosslinkable resins for rendering water-developability and resistance to aqueous ink and for improving printability; and photosensitive resin compositions having a two-phase structure for improving ink acceptability, the continuous phase containing diazo compounds, dichromates, and the disperse phase containing 10 μm or finer particles. All of these compositions can be preferably used as the photosensitive resin compositions in the present invention.

As described above, there are various examples for the photosensitive resin plates used in the present invention. To render hydrophilicity to the hydrophobic components, the main components can be, for example, resins obtained by modification of hydrophobic polymers with carboxylic acids or their salts; mixture of hydrophobic components composed mainly of hydrophobic polymers and hydrophilic components composed mainly of hydrophilic polymers; polymers obtained by chemical bonding of hydrophobic polymers and hydrophilic polymers; and polymers obtained by block copolymerization of hydrophobic monomers as the material of hydrophobic polymers and hydrophilic monomers as the material of hydrophilic polymers. In short, particularly preferred examples are photosensitive flexographic plates in which hydrophilic components are combined in some form with hydrophobic components and they can be dispersed in an aqueous developing solution.

The present invention will be further illustrated below by taking as an example, flexographic plates of water-developable photosensitive resins, which are particularly preferably used as the photosensitive resin plate in the present invention.

For the photosensitive resin plates, the hydrophobic polymers used in the photosensitive flexographic plates, which are particularly preferably used in the present invention, are components which cannot be dissolved or swollen in water, generally referring to compositions of water-insoluble polymers.

The water-insoluble polymer may include, but not limited to, various polymers rendering rubber elasticity to the plates, such as 1,4-polybutadiene, 1,2-polybutadiene, acrylonitrile rubber, butadiene-acrylonitrile rubber, chloroprene rubber, polyurethane rubber, butadiene-styrene copolymers, styrene-butadiene-styrene block copolymers, styrene-isoprene-styrene block copolymers, polyamide resins, unsaturated polyester resins, butadiene-(meth)acrylic acid copolymers, butadiene-(meth)acrylic acid-acrylate copolymers, silicone rubber, polyoxypropylene glycol, and polyoxytetramethylene glycol; and various polymers rendering hardness and stability to the plates, such as acrylic resins, e.g., poly(methyl (meth)acrylate), poly(ethyl (meth)-acrylate), poly(isoproyl (meth)acrylate), poly(n-butyl (meth)acrylate), poly-styrene, polypropylene, polyethylene, chlorinated polyethylene, polyacrylo-nitrile, polyvinyl chloride, polyvinyl acetate and their copolymers, polyurethane resins, polyester resins, polyamide resins, and epoxy resins. These polymers may be used alone or in combination as the hydrophobic components. If necessary, crosslinking agents, radical-polymerizable monomers, photoreaction initiators, antioxidants, polymerization inhibitors, and other additives may be added to these polymers. The above polymers may be modified, if necessary, for allowing them to have reactivity. The above resins may be modified so that they can react with monomers or crosslinking agents, or with each other.

The hydrophilic components are those which can be dissolved or dispersed or swollen in water, and mainly refer to a composition of hydrophilic polymers. The hydrophilic polymer may include, for example, poly-(meth)acrylic acid or polymers of its salts, (meth)acrylic acid or its salt-alkyl (meth)acrylate copolymers, (meth)acrylic acid or its salt-styrene copolymers, (meth)acrylic acid or its salt-vinyl acetate copolymers, (meth)acrylic acid or its salt-acrylonitrile copolymers, polyvinyl alcohol, carboxymethyl cellulose, polyacrylamides, hydroxyethyl cellulose, polyethylene oxide, polyethylene-imine, polyacrylates containing —COOM, —SO$_3$M, —SO$_3$M, or —PO(OM)$_n$ groups (where n is an integer of 1 to 3 and M is hydrogen, a monovalent, divalent, or trivalent metal atom, or an ammonium compound), polyvinyl compounds, polyurethanes, polyureaurethanes, polyesters, epoxy compounds, polyamides, and their salts and derivatives.

If necessary, crosslinking agents, radical-polymerizable monomers, photoreaction initiators, antioxidants, polymerization inhibitors, and other additives may be added to these polymers. The above polymers may be modified, it necessary.

The radical polymerizable monomer may include, for example, styrene, vinyl toluene, chlorstyrene, t-butyle styrene, α-methyl styrene, acrylonitrile, acrylic acid, metacrylic acid, methyl (meth)acrylate, ethyl (meth) acrylate, n-propyl (meth)acrylate, iso-propyl (meth)acrylate, n-butyl (meth)acrylate, iso-butyl (meth)acrylate, sec-butyl (meth)acrylate, t-butyl (meth)acrylate, 2-ethylhexyl (meth) acrylate, n-nonyl (meth)acrylate, n-decyl (meth)acrylate, lauryl (meth)acrylate, n-tridecyl (meth)acrylate, stearyl (meth)acrylate, ethylene glycol mono(meth)acrylate, propylene glycol mono(methyl)acrylate, diethylene glycol mono (meth)acrylate, dipropylene glycol mono(meth)acrylate, polyethylene glycol mono(meth)acryclate, polypropylene glycol mono(meth)acrylate, polyethylene glycol monomethyl ether mono(meth)acrylate, polypropylene glycol monomethyl ether mono(meth)acrylate, polyethylene glycol monoethyl ether mono(meth)acrylate, polypropylene glycol monoethy ether mono(meth)acrylate, n-butoxyethyl (meth) acrylate, phenoxyethyl (meth)acrylate, 2-phenoxypropyl (meth)acrylate, cyclohexyl (meth)acrylate, tetrahydrofurfuryl (meth)acrylate, glycidyl (meth)acrylate, allyl (meth) acrylate, benzyl (meth)acrylate, tribromophenyl (meth) acrylate, (2,3-dichloropropyl (meth)acrylate, 3-chloro-2-hydroxypropyl (meth)acrylate, N,N-diethylaminoethyl (meth)acrylate, N,N-dimethylaminoethyl (meth)acrylate, N-t-butylaminoethyl (meth)acrylate, acrylamide, N,N-dimethylacrylamide, and N,N-diethylacrylamide.

The crosslinking agent may include, for example, various compounds containing two or more radical-polymerizable ethylene groups in a molecule, such as ethylene glycol di(meth)acrylate, diethylene glycol di(meth)acrylate, polyethylene glycol di(meth)acrylate, propylene glycol di(meth) acrylate, dipropylene glycol di(meth)acrylate, polypropylene glycol di(meth)acrylate, 1,3-butyrene glycol di(meth) acrylate, trimethylolpropane tri(meth)acrylate, 1,4-butanediol di(meth)acrylate, neopentyl glycol di(meth) acrylate, 1,6-hexanediol di(meth)acrylate, pentaerythritol di(meth)acrylate, pentaerythritol tri(meth)acrylate, pentaerythritol tetra(meth)acrylate, glycerol di(meth)acrylate, glycerol allyloxy di(meth)acrylate, 1,1,1-trihydroxymethylethane di(meth)acrylate, 1,1,1-trihydroxymethylethane tri(meth)acrylate, 1,1,1-trihydroxymethylpropane di(meth)acrylate, 1,1,1-trihydroxymethylpropane tri(meth)acrylate, triallyl cyanurate, triallyl isocyanurate, triallyl trimellitate, diallyl terephthalate, diallyl phthalate, divinylbenzene, polyurethane (meth)acrylate, and polyester (meth)acrylate. Also included are compounds with two or more reactive functional groups in a molecule, such as ethylene, epoxy, isocyanate, amino, hydroxyl, carboxyl, or other groups.

The photosensitive resin composition containing such hydrophobic and hydrophilic components may have a structure, for example, in which a particle-like disperse phase is formed by the hydrophobic components and a continuous phase by the hydrophilic components surrounding them; a disperse phase is formed by core-shell particles containing the hydrophobic components as the cores and the hydrophilic components as the shells and a continuous phase by other different hydrophilic components surrounding them; the hydrophobic and hydrophilic components form a continuous phase and they are entangled with each other to form a mosaic pattern; or the hydrophobic and hydrophilic components are uniformly dissolved in a compatible state. In these structures, it is preferred that they hydrophilic components and the hydrophobic components forming a continuous phase are not yet chemically crosslinked in an uncured state. On the other hand, the hydrophobic components forming a particle-like disperse phase may or may not be crosslinked in an uncured state. Furthermore, the hydrophobic and hydrophilic components may or may not be chemically bonded with each other.

The photosensitive resin composition can be prepared by well-known techniques, for example, mixing the disperse phase components obtained by emulsion polymerization or suspension polymerization or by pulverization of material polymers, alone or together with the continuous phase components, in a kneader or extruder, followed by making them into a desired structure; kneading the hydrophobic and hydrophilic components in the form of masses in a kneader or extruder for phase separation and dispersion, followed by making them into a desired structure; or kneading the hydrophobic and hydrophilic components in the form of masses in a kneader or extruder for uniform dissolution in a compatible state.

The polymers used for the hydrophilic and hydrophobic components may be those which have been previously polymerized or may be prepared by polymerization of monomers which are mixed in the process of producing the photosensitive resin composition. In particular, the formation of hydrophilic components surrounding the particles of hydrophobic components is often achieved by emulsion polymerization or other techniques.

In this manner, depending on the physical properties required for the starting materials, structure, production process, and other conditions are suitably selected, so that the desired photosensitive resin plates can be obtained.

For example, as the physical properties required for printing plates, preferred form the viewpoint of printing characteristics are a JIS A hardness of 30 to 80, and an impact resilience of 20% or higher.

The photosensitive resin composition is cured by ultra-violet rays. The ultraviolet rays used in the curing are effective, if they are those which have a wavelength of 150 to 500 nm, particularly 300 to 400 nm. Preferred examples of the light source used are low-pressure mercury lamps, high-pressure mercury lamps, carbon arc lamps, ultraviolet fluorescent lamps, chemical lamps, xenon lamps, and zirconium lamps.

In the present invention, the photosensitive resin plates are exposed through negative films having transparent images by irradiation with ultra-violet rays under a light source as described above, and the unexposed non-image portions are removed with a developing solution to give relief images. The uncured photosensitive resin removed remains dissolved, emulsified, or suspended in the developing solution in the developing bath. The development of photosensitive resin plates may be achieved by directly immersing the photosensitive resin plates in the developing solution contained in the developing tank and then rubbing off the unexposed portions from the plates with a brush disposed in the developing tank, or by rubbing off the unexposed portions from the plates with a brush, while pouring a shower of the developing solution on the photosensitive resin plates. The developing solution as sued herein can be water, or a water-based developing solution. The water-based developing solution refers to any one obtained by addition of surfactants, inorganic or organic alkalis, acids or their salts, or other water-soluble compounds to water.

As the surfactants as used herein, there can be widely used anionic, cationic, nonionic, or amphoteric surfactants. Specific examples of the anionic surfactant may include aliphatic carboxylates such as sodium laurate, sodium stearate, and sodium oleate; resin soaps such as sodium abietate and sodium rosin; primary or secondary alkyl sulfates such as sodium lauryl sulfate and lauric acid triethanolamine; primary or secondary polyoxyethylene alkyl ether sulfates such as sodium polyoxyethylene lauryl ether sulfate and polyoxyethylene lauryl ether sulfonic acid triethanolamine; alkyl benzenesulfonates such as sodium lauryl benzenesulfonate and sodium stearyl benzenesulfonate; alkyl naphthalenesulfonates such as sodium propyl naphthalenesulfonate and sodium butyl naphthalenesulfonate; poly-oxyethylene alkyl phenyl ether sulfonates such as sodium polyoxyethylene laryl phenyl ether sulfonate; sulfate oils such as sulfated castor oil and sulfated beef tallow; sulfated fatty acid esters such as sulfated butyl oleate; alkyl sulfosuccinates such as sodium dioctyl sulfosuccinate; α-olefin sulfonates; hydroxylakane sulfonates; N-methyl-N-alkyltauline salts; N-alkyl sulfosuccinic acid monoamide salts; fatty acid monoglyceride sulfuric acid ester salts; alkyl diphenyl ether disulfonicates; alkyl phosphate salts such as lauric alcohol monophosphate disodium salts and lauric alcohol disphosphate sodium salts; polyoxyethylene alkyl phosphate salts such as polyoxyethylene lauryl ether monophosphate disodium salts and polyoxyethylene lauryl ether disphosphate sodium salts; naphthalenesulfonate formalin condensates; salts of partially saponified styrene-maleic anhydride copolymers; and salts of partially saponified olefin-maleic anhydride copolymers. The above specific examples, although sodium salts are mainly taken therefor, may also include, but are not particularly limited to, potassium salts, ammonium salts, magnesium salts, calcium salts, and other salts.

Specific examples of the cationic surfactants are primary, secondary, and tertiary amine salts such as monostearylammonium chloride, distearyl-ammonium chloride, and tristearylammonium chloride; quaternary ammonium slats such as stearyltrimethylammonium chloride, distearyldimethyl-ammonium chloride, and stearyldimethylbenzylammonium chloride; alkyl-pyridinium salts such as N-cetylpyridinium chloride and N-stearylpyridinium chloride; N,N-dialkylmorpholinium salts; fatty acid amide salts of polethylenepolyamine; acetic acid salts of urea compounds of amides of aminoethylethanolamine and stearic acid; and 2-alkyl-1-alkyl-1-hydroxy-ethylimidazolinium chloride. The specific examples, although chlorides are mainly taken therefor, may also include, but are not particularly limited to, bromides, alkylsulfates, acetates, and other forms.

Specific examples of the nonionic surfacts are polyoxyethylene alkyl ethers such as polyoxyethlene oleyl ether and polyoxyethylene lauryl ether; polyoxyethylene alkyl phenyl ethers such as polyoxyethylene nonyl phenyl ether and polyoxyethylene octyl phenyl ether; polyoxyethylene polyoxypropylene glycols; mono- and diesters of fatty acids with polyethylene glycol, such as polyethylene glycol monostearate and polyethylene glycol monooleate; esters of fatty acids with sorbitan, such as sorbitan monolaurate and sorbitan monooleate; esters of polyoxyethylene adducts of sorbitan with fatty acids, such as polyoxyethylene sorbitan monolaurate, polyoxyethylene sorbitan monostearate, and polyoxyethylene sorbitan trilaurate; esters of fatty acids with sorbitor, such as sorbitol monopalmitate and sorbitol dilaurate; esters of polyoxyethylene adducts of sorbitol with fatty acids, such as polyoxyethylene sorbitol monostearate and polyoxyethylene sorbitol dioleate; esters of fatty acids with pentaerythriol, such as pentaerythritol monostearate; esters of fatty acids with glycerin, such as glycerin monolaurate; fatty acid esters of sugar and sucrose; fatty acid alkanolamides such as lauric acid diethanolamide and lauric acid monoethanolamide; amine oxides such as lauryldimethylamine oxide; fatty acid alkanolamines such as stearyldiethanolamine; polyoxyethylene alkylamines; and triethanolamine fatty acid esters.

Specific examples of the amphoteric surfactants are amino acid-type amphoteric surfactants such as sodium laurylaminopropionate; carboxy-betaine-type amphoteric surfactants such as lauryldimethylbetaine and lauryldihydroxyethylbetaine; sulfobetaine-type amphoteric surfactants such as stearyldimethylsulfoethyleneammonium ethyleneammonium betaine; imidazoliniumbetaine-type amphoteric surfactants; and lecithin. Examples of the inorganic and organic alkalis, acids, salts, and other water-soluble compounds are alkalis such as lithium hydroxide, sodium hydroxide, potassium hydroxide, calcium hydroxide, ammonia, alkanolamines, e.g., mono-ethanolamine, diethanolamine, and triethanolamine; acids such as hydrochloric acid, sulfuric acid, nitric acid, phosphoric acid, formic acid, acetic acid, oxalic acid, succinic acid, citric acid, maleic acid, and p-toluenesulfonic acid; salts such as sodium carbonate, sodium hydrogencarbonate, sodium tripoly-phosphate, potassium pyrophosphate, sodium silicate, sodium sulfate, sodium chloride, sodium borte, sodium acetate, magnesium acetate, sodium citrate, and sodium succinate; sulfonates such as sodium benzenesulonate, sodium toluenesulfonate, sodium xylenesulfonate, sodium styrenesulfonate, sodium phenol-2,4-disulfonate, and sodium methylsulfoante; salts of alkyl sulfates; and high molecular weight compounds such as carboxymethyl cellulose and methyl cellulose. If necessary, various additives may be added, such as viscosity improvers, dispersion stabilizers, flocculating agents, and zeolite.

The developing solution used in the present invention, although it is an aqueous solution, may contain water-soluble organic solvents such as ethanol, isopropanol, cellosolve, glycerin, polyethylene glycol, dimethylformamide, diemthylacetamide, and acetone.

The pH of the developing solution is not particularly limited to, but is preferably in the range of 3 to 12 from the viewpoint of operational safety. The temperature during development is preferably in the range of 10° C. to 50° C.

In the present invention, the resin content of a developing solution is preferably kept lower than 3% by weight, more preferably 2.5% by weight or lower, and particularly preferably 1.5% by weight or lower. To always keep the resin content of a developing solution at a constant level, it is necessary to remove a part of the developing solution from the developing solution tank and add a fresh developing solution to the developing tank. The addition of a developing solution can be achieved by mixing developing agents with water at suitable concentrations in the additional developing solution tank and then adding the resulting developing solution to the developing solution tank, or by placing only developing agents or high-concentration solutions of developing agent sin the additional developing solution tank, and transferring these agents or solutions to the developing solution tank, while pouring water through another pipe into the developing solution tank. In any way, it is not particularly limited to these methods, so long as a shortage of water and developing agents in the developing solution tank is well compensated for. The developing solution tank as used herein refers to any one to contain a developing solution for development. The development may be carried out directly in the developing solution tank or after transferring the developing solution from the developing solution tank to the developing tank separately provided for development.

It is important at this point that the addition is carried out under a balance kept between the volume of a developing solution removed from the developing solution tank and the volume of a developing solution added to the developing solution tank. Such a balance can be taken by, for example, making use of a overflow for the transfer of a developing solution from the developing unit to the waste disposal tank, or removing a waste developing solution from the developing unit when the liquid level of the developing solution in the developing unit comes to a height equal to or higher than the level gauge disposed in the developing unit by the addition of a fresh developing solution, or adding a fresh developing solution to the developing unit when the liquid level of the developing solution in the developing unit comes to a height equal to or lower than the level gauge disposed in the developing unit by the removal of a waste developing solution.

The developing solution containing the resin of unexposed portions (i.e., waste developing solution), which has occurred in the development of photosensitive resin plates, should be removed from the developing solution tank. This can be achieved by, for example, (I) adding flocculants (any one available, so long as it can flocculate the resin; including pH adjusters or flocculating aids) to the resin-containing waste developing solution, followed by treatment for separation of flocculated solids from liquids, or (II) using a membrane filter in the treatment of the waste developing solution for separation of solids and liquids. The transfer of the waste developing solution may be carried out in a continuous manner or intermittently at intervals of a fixed period or volume.

The method I can be carried out be various procedures, for example, adding flocculants, pH adjusters, or flocculating aids to the resin-containing waste developing solution, followed by well mixing to flocculate the resin and developing agents contained in the developing solution, and then transferring the flocculated waste developing solution from the waste disposal tank to the solid-liquid separating unit for separation of flocculated solids and waste liquids. This operation may be carried out in a batch manner that the waste disposal tank is filled with the waste developing solution at a fixed or larger volume, after which the transfer of the developing solution from the developing tank to the waste disposal tank is suspended and flocculants are added to the waste disposal tank, followed by flocculation treatment and the subsequent transfer to the solid-liquid separating unit, or in a continuous manner using a waste disposal tank, followed by flocculation treatment and the addition of flocculants or others is made at the same time as the receipt of the waste developing solution, while transferring the solution after treated for flocculation to the solid-liquid separating unit. The solid-liquid separating unit can be any of various well-known devises based on filtration such as natural gravity filtration, pressure filtration, vacuum filtration, or other means of filtration with belt filters or press filters, or on centrifugal separation or natural sedimentation. The solids and liquids thus separated can be further treated for their disposal or recycling by any method as the need arises.

The flocculant used in the method I is not particularly limited to, so long as it has the ability to deposit or flocculate the resin, developing agents, or others in the resin-containing developing solution, and there can be widely used acids or alkalis for neutralization, inorganic flocculants, high molecular flocculants, or others. The acids may include, for example, inorganic acids such as hydrochloric acid, sulfuric acid, nitric acid, phosphoric acid, and boric acid; and organic acids such as formic acid, acetic acid, lactic acid, succinic acid, and citric acid. The alkalis may include, for example, inorganic alkalis such as sodium hydroxide, potassium hydroxide, sodium carbonate, potassium carbonate, sodium borate, potassium borate, and ammonia; organic alkalis such as sodium acetate, potassium acetate, sodium succinate, and sodium citrate; and organic amines such as diethanolamine and dimethylaminoethanol. The inorganic flocculants may include, for example, polyvalent metal salts such as calcium oxide, calcium chloride, magnesium chloride, aluminum polychloride, aluminum sulfate, various kinds of alum, ferric chloride, and ferric sulfate. The organic flocculants may include, for example, polyethyleneimine, polyacrylamide, polyacrylic acid, polyacrylic acid salts, and polyacrylamide-acrylic acid copolymers. In addition, various aids may be used together, such as kaolin, bentonite, diatomaceous earth, or activated carbon.

The method II can be carried out by for example, recycling a developing solution, simultaneously with development, by the use of a developing solution recycling unit in which filtration is made in the circulation of the developing solution between the developing unit, the concentration tank, and the membrane filter. More specifically, a part of the resin-containing developing solution in the developing unit is transferred from the developing unit to the concentration tank in a continuous manner or at fixed intervals, and the resin-containing developing solution in the concentration tank is filtered and concentrated. The filtrate is returned to the developing unit for reuse as the developing solution. For this reason, the development and recycling can be carried out in a continuous manner without suspending the development for the recycling of a developing solution, and the resin content of the developing solution in the developing unit can be always kept at a fixed level or lower.

The material of membrane filters may include, but is not particularly limited to, organic membranes such as made of polysulfone resins, polyimide resins, polyacrylonitrile resins, cellulose acetate, ethyl cellulose, or nitrocellulose; ceramic membranes such as made mainly of alumina, silica, titanium oxide, or zirconium; and metal membranes such as made of sintered metals. The membrane filter module may preferably has a shape such as a hollow fiber or tubular shape for organic membranes or a tubular or multi-lumen shape for ceramic or metal membranes. The filtration in the present invention can be preferably carried out by the cross-flow method in which an untreated solution is allowed to make a circulating flow through the module of a membrane filter and a part of the solution is taken out as the filtrate.

In the present invention, the rate of an untreated solution flowring through the membrane filter module is preferably set so that the flow rate of an untreated solution comes to 0.2 m/sec or higher relative to the membrane filter. If the rate is lower than that, the membrane filter will cause clogging or the flow rate of filtration will be remarkably lowered. The pressure of an untreated solution applied to the membrane filter may vary depending on the kind of membrane used, but is preferably 0.2 kg/cm$^2$ or higher. The membrane filter may be provided with a mechanism of backwashing under the application of a pressure on the filtrate side at intervals of fixed time in order to prevent the flow rate of filtration from being lowered by clogging.

This operation of filtration is called "ordinary operation", in which the resin content of the developing solution in the concentration tank is gradually increased. The ordinary operation is usually carried out until the resin content of the developing solution comes to about 5% to 20%, and the transfer of the developing solution from the developing unit to the concentration tank is then suspended, in which state the recycling of the developing solution with a membrane filter is continued. As the result, the volume of the resin-containing developing solution in the concentration tank becomes smaller than observed at the time of ordinary operation, thereby increasing the resin content. This operation is called "operation of additional concentration". According to the operation of additional concentrations, the resin content of the developing solution in the concentration tank can be increased up to 15% to 50%, and the volume of the developing solution can be reduced to about 70% to 20% of the volume observed at the time of ordinary operation. The resin-containing developing solution in the concentration tank after the additional concentration is subjected to waste disposal. In one aspect, the present invention is characterized in that the additional concentration is carried out just before the waste disposal of the resin-containing developing solution in the concentration tank.

According to the method II, two contrary requirements can be met, i.e., the one is that at the time of ordinary operation, the filtration with a membrane filter can be carried out in such a state that the resin content of the developing solution in the concentration tank is relatively low, and the high flow rate of filtration can therefore be secured; and the other is that when the resin-containing developing solution in the concentration tank is subjected to waste disposal, the concentration can be continued to such an extent that the resin content of the developing solution in the concentration tank becomes relatively high, whereas the volume of the resin-containing developing solution to be subjected to waste disposal is reduced. The resin-containing developing solution, after removed, can be subjected to the waste disposal by, for example, removing the resin by well-known methods such as flocculation, centrifugation, filtration, or drying under ordinary or reduced pressure, followed by discarding; making the solution into a solid with a water-absorbing material, followed by discarding; or directly incineration, followed by discarding. In this case, the present invention makes it possible that the waste disposal can be easily carried out at a low cost because of a small volume of the solution reduced by high-level concentration. Thus the concentration waste solution is subjected to the waste disposal; therefore, the total volume of the developing solution is reduced after the treatment as compared with the original one. For this reason, stable development, while recycling the developing solution, for a long period of time can be achieved by addition of water and other developing agents at the volumes corresponding to the concentrated solution subjected to the waste disposal.

The present invention will be further illustrated below by reference to the drawings. The developing system of the present invention is divided into two types: developing system employing method I for concurrent waste disposal (herein after referred to as developing system I); and (II) developing system employing method II for concurrent waste disposal (hereinafter referred to as developing system II).

FIG. 1 is a schematic flow diagram showing an example of developing system I according to the present invention. In FIG. 1, additional developing solution tank 1 is provided with supply pipe 11 having valve 13, level gauges 21, 22, stirrer 18, temperature sensor 25, and heater 29, in which tank a developing solution prepared in another tank is contained or a developing solution is prepared. The developing solution is transferred to developing unit 2 through pipe 8 having valve 14 by constant flow pump 20. In the developing unit 2, there are disposed photosensitive resin plate setting stand 32, developing brush 33, heater 28, and temperature sensor 26. The photosensitive resin plate 34 is developed in this developing unit 2. The developing unit 2 is further provided with pump 30 and pipe 31, allowing the developing solution to circulate and thereby making a forced flow of the developing solution in the developing unit 2.

The developing unit 2 has pipe 9 for discharge by an overflow of the resin-containing developing solution at the same height as the liquid level of the developing solution. The resin-containing developing solution is placed in the reserve tank 3 and further transferred through the pipe 10 having solenoid operated valve 15 to the resin flocculating unit 4. The resin flocculation unit 4 is provided with stirred 19, level gauge 23, pH meter 24, and feeder 27. When the liquid level of the resin-containing developing solution in the resin flocculating unit 4 comes to a height equal to or higher than the level gauge 23, the solenoid operated valve 15 is closed, and to the resin flocculating unit 4 are added a powdered flocculant from the feeder 27 and a liquid flocculant and/or a pH adjuster from the flocculant tank 7 through pipe 12 having solenoid operated valve 17. At the time when the pH becomes suitable as measured by the pH meter 24 in the resin flocculating unit 4, the solenoid operated valve 17 is closed to complete the addition of the flocculant. After the fixed time, the solenoid operated valve 16 is opened, and the waste solution subjected to the flocculation is transferred onto and filtered through the non-woven fabric filter 6 in the filter tank 5. After the completion of filtration, the solenoid operated valve 16 is closed and the solenoid operated valve 15 is opened, whereby the waste developing solution is stored again in the waste disposal tank 4. The filtrate is purified by various type of treatment, and then reused or discarded in a sewer or other systems, whereas the filter cake is treated as the solid waste matter.

In the developing system I, the resin flocculating unit may be a tank provided with a stirrer or a pipe having a stirring function to flocculate the resin. To make the operation simpler and easier, various methods or units can be added. For example, various tanks can be added, such as tanks for separate preparation of a developing solution, and reserve tanks disposed between the developing solution tank and the waste disposal tank for the temporary storage of a waste developing solution discharged from the developing solution tank during the waste disposal; and various sensors such as pH meters can be provided in the waste disposal tank. There can be further disposed various units optionally as the need arises, including automatic flocculant feeding units, automatic developing agent feeding units, stirring, heating, and cooling units, pipes, solenoid operated valves, and automatic controllers for these units.

Figure 2:
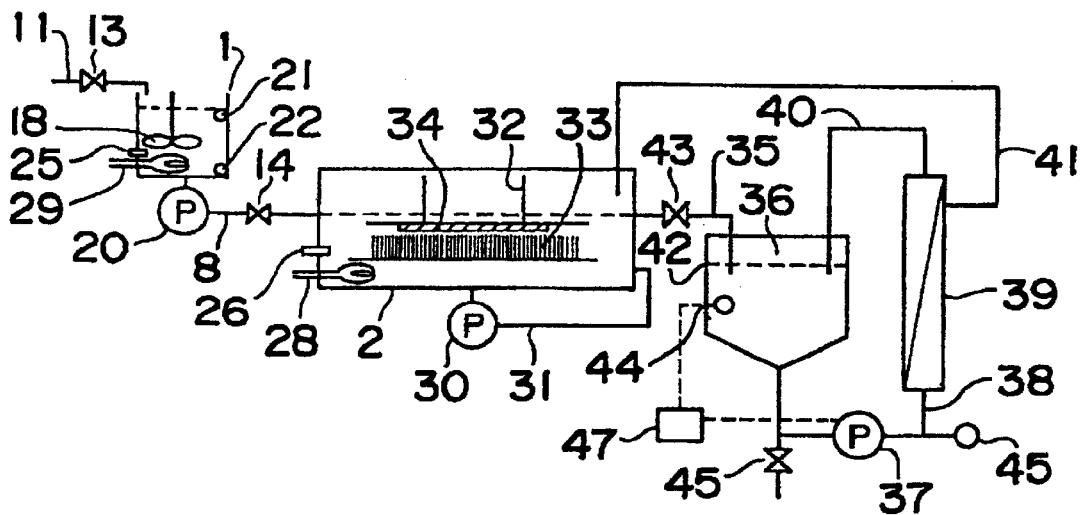
FIG. 2 is a schematic flow diagram showing an example of developing system II according to the present invention.
Figure 3:
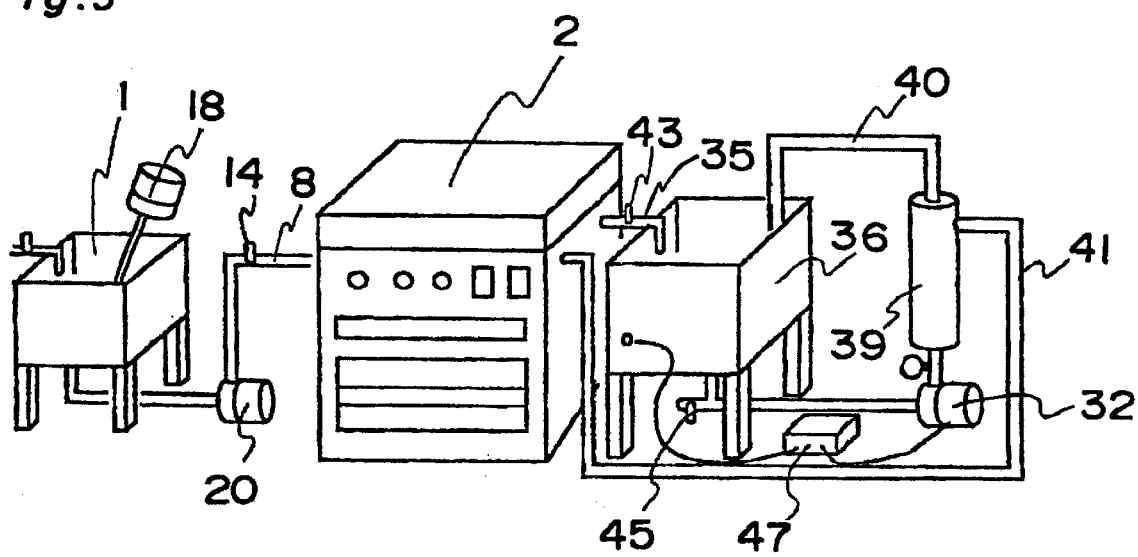
FIG. 3 is a schematic perspective view showing an apparatus used in the developing system II according to the present invention.

FIG. 2 is a schematic flow diagram showing an example of developing system II according to the present invention. FIG. 3 is a schematic perspective view showing an apparatus used in the developing system II. In FIGS. 2 and 3, the members used on or before the development are the same as in the developing system I. The developing solution discharged by an overflow from the developing unit 2 is transferred through pipe 35 having valve 43 to and stored in the concentration tank 36. The waste solution is transferred through pipe 38 to membrane filter module 39 by circulating pump 37 and returned through pipe 40 to the concentration tank 36, making a repeated circulation on this line. The filtrate discharged from the membrane filter module 39 is returned through pipe 41 to the developing unit 2. In this "ordinary operation", the developing solution only at a volume corresponding to the filtrate returned to the developing unit 2 is transferred by an overflow from the developing solution 2 to the concentration tank 36, so that the liquid level of the developing solution in the concentration tank 36 is kept substantially constant at the position 42.

When the resin content of the developing solution in the concentration tank 36 becomes higher to a fixed level, the valve 43 is closed to suspend the transfer of the developing solution form the developing unit 2, followed by additional concentration. This results in a gradual decrease in the liquid level and an increase in the resin content of the developing solution in the concentration tank 36. When the liquid level of the developing solution in the concentration tank 36 comes to a height equal to or lower than the level gauge 44, the level gauge 44 is switched on to operate pump regulator 47 and the pump 37 is stopped, thereby breaking the additional concentration. The resin-containing developing solution in the concentration tank 36, membrane filter module 39, and pipes 38, 40 is removed by opening the valve 45 for removal of concentrated solutions, and then subjected to waste disposal. After that, the valve 45 is closed and valve 43 is opened, so that the developing solution was added at a volume corresponding to the shortage, followed by operation of pump 37, thereby resuming the ordinary concentration.

These apparatus are equipped only with the members requisite for the present invention. They can be further equipped with other members, as the need arises, including pre-filters for preventing any large scum from entering into the filter module to block the passage in the module; measuring instruments such as pressure gauges and thermometers; piping equipment such as bypass pipes, pumps, and valves; temperature regulating units such as heaters and coolers; and automatic charging units for water, surfactants, or additives.

EXAMPLES

The present invention will be further illustrated by the following Examples; however, the present invention is not limited to these Examples.

Examples 1 to 6

A flexographic photosensitive resin plate (Cosmolight CLH available from Toyo Boseki K. K.) was cut in the A1 size, and an appropriate negative film having fine lines with various line widths and solid patterns (exposed portion, 50%) was brought into close contact therewith, followed by the printing of the lines and patterns by application of light from a mercury lamp with an illumination of 25 W/m$^2$ for 5 minutes. After removing the negative film, an apparatus as shown in FIG. 1 was used for development in various developing solutions (developing solution tank volume, 250 liters) at 40° C. by rubbing with a nylon brush so that the relief depth came to about 1 mm. The development was carried out at a rate of 2 plates for 1 hour, and 30 plates were developed in total. At the same time, the developing solution was placed at a volume of 100 kiters in a developing solution addition tank, and added to the developing unit at a rate of 50 liters for 1 hour. The waste disposal tank was set so that the operation of waste disposal was conducted once at every time when the resin-containing developing solution was collected at a volume of 100 liters. As a liquid flocculant or a pH adjuster, a 35% aqueous aluminum polychloride solution or a 10% aqueous sulfuric acid solution was used, and depending on the developing agents used, a powdered flocculant or a flocculating aid was added at a fixed amount. The 35% aqueous aluminum polychloride solution or the 10% aqueous sulfuric acid solution was added in small portions, while monitoring the pH in the waste disposal tank with a pH meter. Setting was made so that electromagnetic valve 17 was completely closed when the pH became to 7. The resin content in the developing solution tank after the development of 30 plates was measure, and the cleanliness in the tank was observed. The results are shown in Table 1.

Comparative Example 1

Exposure and development were carried out in all the same manner as described in Example 2, except that the addition of a fresh developing solution was omitted. Developed were 30 photosensitive flexographic plates. The results are shown in Table 1.

Comparative Example 2

Exposure and development were carried out in all the same manner as described in Example 5, except that the addition of a fresh developing solution was omitted. Developed were 30 photosensitive flexographic plates. The results are shown in Table 1.

TABLE 1

| | | After development of 30 plates | |
|---|---|---|---|
| | Developing agents (addition amount) | Resin content of developing solution | Cleanliness in developing unit |
| Example 1 | sodium vegetable oil fatty acid (0.7%) sodium carbonate (0.3%) | 1% | no problem |
| Example 2 | sodium alkyl sulfate (1.0%) sodium carbonate (0.2%) | 1% | no problem |
| Example 3 | sodium vegetable oil fatty acid (0.7%) sodium carbonate (0.3%) sodium borate (0.5%) | 1% | no problem |
| Example 4 | sodium vegetable oil fatty acid (0.6%) coconut oil fatty acid diethanolamide (0.4%) | 1% | no problem |
| Example 5 | polyoxyethylene nonyl phenyl ether (0.3%) sodium carbonate (0.3%) sodium tripolyphosphate (0.4%) | 1% | no problem |
| Example 6 | polyoxyethylene nonyl phenyl ether (0.3%) sodium carbonate (0.3%) sodium tripolyphosphate (0.4%) | 1% | no problem |
| Comparative Example 1 | sodium vegetable oil fatty acid sodium carbonate | 3% | scum formation brush clogging |
| Comparative Example 2 | polyoxyethylene nonyl phenyl ether sodium carbonate sodium tripolyphosphate | 3% | scum formation brush clogging |

Examples 7 to 16

A flexographic photosensitive resin plate (Cosmolight CLH available from Toyo Boseki K. K.; thickness, 1.7 mm)

was cut in the A2 size, and an appropriate negative film having fine lines with various line widths and solid patterns (exposed portion, 50%) was brought into close contact therewith, followed by the printing of the lines and patterns by application of light from a mercury lamp with an illumination of 25 W/m² for 5 minutes. After removing the negative film, an apparatus as shown in FIG. 2 was used for development in various developing solutions at 40° C. by rubbing with a nylon brush so that the relief depth came to about 1 mm.

The developing solution was placed at a volume of 50 liters in the developing unit, and the same developing solution at a volume of 20 liters in the concentration tank, followed by circulation and filtration. The filtrate was returned through the pipe 7 to the developing unit, and a part of the developing solution was fed by overflow from the developing unit to the concentration tank 36. At that time, the developing solution was contained at a volume of 15 liters in the concentration tank 36, and at a volume of 3 liters in the membrane filer 39 and the pipes, and at a volume of 52 liters in the developing unit, including the level-increased volume for overflow.

Under these conditions, the photosensitive flexographic plates previously prepared above were developed at a rate of 1 plate for 20 minutes. After 20 plates were continuously developed, valve 43 was closed to stop the transfer of the developing solution from the developing unit, followed by additional concentration. After about 10 minutes, the level of the developing solution in the concentration tank 36 came below the level gauge 44, and pump 37 was stopped. The resin-containing developing solution in the concentration tank 36 and membrane filter module 39, pipes 38 and 40 was removed by opening the valve 45 for removal of concentrated solutions, and subjected to waste disposal, at which time the volume of the waste solution was 9 liters. After that, the valve 45 was closed and valve 43 was opened, so that the developing solution was added at a volume corresponding to the shortage, followed by the running of pump 37 for resumption of the ordinary concentration. This operation was repeated ten times, and the development was carried out for 200 plates in total. Just after the initiation of the development and just before the additional concentration on and after the second time in a series of operations, the flow rate of filtration, the resin content of the developing solution in the developing unit, and the resin content of the developing solution in the concentration tank were measured.

Furthermore, the resin content and volume of the waste developing solution were measured. The results are shown in Table 2. The following membrane filters of the hollow fiber type, designated at "A", "B", and "C", were used. The following developing solutions, designated at "a", "b", "c", "d", "e", and "f", were used.

A. with a cut-off molecular weight of 50,000 (HF-5-43-PM50-PB available from Coach Membrane System Co.)

B. with a cut-off molecular weight of 500,000 (HF-5-43-PM500-PB available from Coach Membrane System Co.)

C. with a pore size of 0.1 $\mu$m (HF5-43-PMF0.1-PB available from Coach Membrane System Co.)
  a. sodium carbonate, 0.3% sodium tripolyphosphate, 0.5% polyoxyethylene nonyl phenyl ether, 0.2%
  b. sodium carbonate, 0.3% borax, 0.3% sodium lauryl sulfate, 0.4%
  c. sodium carbonate, 0.3% sodium vegetable oil fatty acid, 0.7%
  d. sodium butylnaphthalenesulfonate, 4%
  e. coconut oil fatty acid diethanolamide, .3% sodium vegetable oil fatty acid, 0.4% diethanolamine, 0.1%
  f. sodium carbonate, 0.2% sodium lauryl benzenesulfonate, 0.6%

TABLE 2

| | Membrane filter used | Developing solution | At beginning development | | Just before additional concentration | | | Resin content of waste developing solution (%) | Total volume of waste developing solution after development of 200 plates (L) | Cleanliness in developing unit after development of 200 plates |
|---|---|---|---|---|---|---|---|---|---|---|
| | | | Flow rate of filtration (L/hr/m²) | Resin content in developing unit (%) | Flow rate of filtration (L/hr/m²) | Resin content in developing unit (%) | Resin content in concentration tank (%) | | | |
| Example 7 | A | a | 100 | 0.8 | 90 | 1.0 | 11 | 22 | 90 | no problem |
| Example 8 | A | b | 100 | 0.8 | 90 | 1.0 | 11 | 21 | 90 | no problem |
| Example 9 | B | a | 130 | 0.6 | 110 | 0.8 | 12 | 24 | 90 | no problem |
| Example 10 | B | b | 130 | 0.6 | 110 | 0.8 | 12 | 24 | 90 | no problem |
| Example 11 | B | c | 120 | 0.6 | 90 | 1.0 | 11 | 22 | 90 | no problem |
| Example 12 | C | b | 150 | 0.5 | 120 | 0.7 | 13 | 25 | 90 | no problem |
| Example 13 | C | c | 130 | 0.6 | 90 | 1.0 | 11 | 22 | 90 | no problem |
| Example 14 | C | d | 130 | 0.6 | 100 | 1.0 | 11 | 22 | 90 | no problem |
| Example 15 | C | e | 120 | 0.6 | 90 | 1.0 | 11 | 22 | 90 | no problem |
| Example 16 | C | f | 130 | 0.6 | 80 | 1.0 | 11 | 22 | 90 | no problem |

Comparative Examples 3 to 5

Exposure and development were carried out in the same manner as described in Example 7, and the resin-containing used developing solution in the concentration tank after the development of 20 plates was subjected to waste disposal without any addition or concentration. This operation was repeated ten times to achieve the development of 200 plates in total. The results are shown in Table 3.

Comparative Examples 6 to 8

Exposure and development were carried out in the same manner as described in Example 7, and the resin-containing used developing solution in the concentration tank after the development of 40 plates, i.e., two times the number of plates developed in Example 7, was subjected to waste disposal without any addition or concentration. This operation was repeated five times to achieve the development of 200 plates in total. The results are shown in Table 3.

TABLE 3

|  | Membrane filter used | Developing solution | At beginning development | | Just before additional concentration | | | Resin content of waste developing solution (%) | Total volume of waste developing solution after development of 200 plates (L) | Cleanliness in developing unit after development of 200 plates |
|---|---|---|---|---|---|---|---|---|---|---|
|  |  |  | Flow rate of filtration (L/hr/m²) | Resin content in developing unit (%) | Flow rate of filtration (L/hr/m²) | Resin content in developing unit (%) | Resin content in concentration tank (%) |  |  |  |
| Comparative Example 3 | A | a | 100 | 0.8 | 90 | 1.0 | 11 | 22 | 180 | no problem |
| Comparative Example 4 | A | b | 100 | 08 | 90 | 1.0 | 11 | 11 | 180 | no problem |
| Comparative Example 5 | C | c | 130 | 0.7 | 90 | 1.0 | 11 | 11 | 180 | no problem |
| Comparative Example 6 | A | a | 100 | 1.1 | 35 | 2.6 | 21 | 21 | 90 | resin adhesion to brush |
| Comparative Example 7 | B | d | 120 | 1.2 | 30 | 2.9 | 20 | 20 | 90 | resin adhesion to brush |
| Comparative Example 8 | C | e | 150 | 1.2 | 25 | 3.6 | 18 | 18 | 90 | resin adhesion to brush |

In Tables 2 and 3, the flow rates of filtration and the resin contents were respectively expressed as the average of measurements on and after the second operation, and the volumes of the waste developing solution as the total volumes of the developing solution discharged from the system during the development of 200 plates.

As can be seem form Table 2, in Examples 7 to 16, the resin contents of the developing solution in the developing unit were kept low even after the development of 20 plates, and a small decrease was found in the flow rates of filtration. The volumes of the waste developing solution were reduced by the addition and concentration.

As can be seen form Table 3, in Comparative Examples 3 to 5, the resin contents of the developing solution in the developing unit were kept low even after the development of 20 plates, and a small decrease was found in the flow rates of filtration; however, the volumes of the waste developing solution were increased because of neither addition nor concentration. In Comparative Examples 6 to 8, the volumes of the waste developing solution were kept small; however, the flow rates of filtration became low after the development of 40 plates, so that the treatment could not keep up with and the resin content of the developing solution in the developing unit became increased, causing brush clogging with the precipitated resin.

According the developing system of the present invention and the apparatus used therefor, the resin content of the developing solution can be kept substantially constant even when may photosensitive resin plates are developed. Therefore, the amount of scum formed by flocculation is small, so that the prevention of images from being disturbed by the scum adhering to the developed plate can be achieved at the printing. In addition, various troubles can be prevented, which are caused by the adhesion of scale or scum to the brush of the developing unit or to the liquid-contact portions of the pipes, filters, or other assemblies. Furthermore, the use of an aqueous developing solution makes easy the waste disposal by well-known techniques such as pH adjustment, addition of adsorbents or flocculants agents, and microbial treatment, making a great contribution to the industrial field.

What is claimed is:

1. A method for developing photosensitive resin plates with an aqueous developing solution and for treating a waste developing solution, which method comprises: adding a fresh developing solution to a developing unit in a continuous manner or at intervals of a fixed period, while removing a part of the resin-containing developing solution from the developing unit, whereby the resin content of the developing solution in the developing unit is kept substantially constant and the treatment of the waste developing solution is carried out in parallel with the development.

2. A method for developing photosensitive resin plates according to claim 1, wherein the resin-containing developing solution is treated for separation of solids and liquids with a flocculant and then subjected to the waste disposal.

3. A method for developing photosensitive resin plates according to claim 1, wherein the resin-containing developing solution is treated for separation of solids and liquids with a membrane filter and then subjected to the waste disposal.

4. A method for developing photosensitive resin plates according to claim 1, wherein a developing solution recycling unit in which filtration is made in the circulation of the resin-containing developing solution between the developing unit, a concentration tank, and a membrane filter module is used so that the part of the resin-containing developing solution is transferred from the developing unit to the concentration tank in a continuous manner or at intervals of a fixed period and the resin-containing developing solution in the concentration tank is concentrated by the filtration, of which filtrate is returned to the developing unit, and just before the waste disposal of the resin-containing developing solution in the concentration tank, the transfer of the developing solution from the developing unit to the concentration tank is suspended to reduce the volume of and increase the resin content of the resin-containing developing solution in the concentration tank, after which the concentrated waste developing solution is subject to the waste disposal.

5. An apparatus used in a developing system of photosensitive resin plates, which apparatus comprises:
   (i) a developing solution supply tank;
   (ii) a developing unit;
   (iii) a waste disposal tank;
   (iv) a resin flocculating unit;
   (v) a solid-liquid separating unit for separating resin from liquid of a resin-containing developing solution;
   (vi) a unit for feeding a developing solution from the developing solution supply tank to the developing unit; and (vii) a pipe for removing a part of the developing solution from the developing unit to the waste disposal tank, wherein the unit for feeding the developing solution is capable of keeping the resin content of the developing solution substantially constant in the developing unit.

6. An apparatus used in a developing system of photosensitive resin plates, which apparatus comprises:

(i) a developing solution supply tank;

(ii) a developing unit;

(iii) a pipe for feeding a developing solution from the developing solution supply tank to the developing unit;

(iv) a concentration tank;

(v) a pipe for transferring a waste developing solution from the developing unit to the concentration tank;

(vi) a membrane filter module containing at least one membrane filter selected from the group consisting of reverse osmosis membrane filters, ultrafiltration membrane filters, and microfiltration membrane filters;

(vii) a circulating pump for transferring the waste solution from the concentration tank to the membrane filter module;

(viii) a pipe for returning a circulating waste solution discharged as a cross-flow from the membrane filter module to the concentration tank;

(ix) a pipe for returning the filtrate discharged from the membrane filter module to the developing unit;

(x) a valve for suspending the transfer of the developing solution, which valve is disposed on the pipe for transferring the developing solution from the developing unit to the concentration tank;

(xi) a level gauge disposed in the concentration tank;

(xii) a means of stopping a circulating pump when the liquid level in the concentration tank comes to a height equal to or lower than the level gauge; and (xiii) a pipe for removing the developing solution from the concentration tank.

* * * * *